United States Patent
Lee et al.

(10) Patent No.: US 8,304,859 B2
(45) Date of Patent: Nov. 6, 2012

(54) OPTICAL INTERCONNECTION DEVICE

(75) Inventors: Sang-Heung Lee, Daejeon (KR); Hae Cheon Kim, Daejeon (KR); Eun Soo Nam, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 154 days.

(21) Appl. No.: 12/847,174

(22) Filed: Jul. 30, 2010

(65) Prior Publication Data

US 2011/0037078 A1 Feb. 17, 2011

(30) Foreign Application Priority Data

Aug. 14, 2009 (KR) .................. 10-2009-0075063

(51) Int. Cl.
 *H01L 21/02* (2006.01)
 *H01L 27/14* (2006.01)

(52) U.S. Cl. .. 257/616; 257/414; 257/431; 257/E33.077

(58) Field of Classification Search .................. 257/84, 257/80, E33.077, 414, 431, 616
See application file for complete search history.

(56) References Cited

U.S. PATENT DOCUMENTS 7,148,526 B1 * 12/2006 An et al. ................ 257/288
2001/0031109 A1 10/2001 Paniccia et al.

FOREIGN PATENT DOCUMENTS

| JP | 2006-023579 A | 1/2006 |
| KR | 10-0352076 B1 | 8/2002 |
| KR | 2008-0052232 A | 6/2008 |

OTHER PUBLICATIONS

Korean Patent Publication 10-2008-0052232—English translation.*

* cited by examiner

*Primary Examiner* — A. Sefer
*Assistant Examiner* — Nikolay Yushin
(74) *Attorney, Agent, or Firm* — Rabin & Berdo, P.C.

(57) ABSTRACT

Provided is an optical interconnection device. The optical interconnection device include: a first semiconductor chip disposed on a germanium-on-insulator (GOI) substrate; a light emitter on the GOI substrate, the light emitter receiving an electrical signal from the first semiconductor chip and outputting a light signal; a light detector on the GOI substrate, the light detector sensing the light signal and converting the sensed light signal into an electrical signal; and a second semiconductor chip on the GOI substrate, the second semiconductor chip receiving the electrical signal from the light detector.

7 Claims, 2 Drawing Sheets

US 8,304,859 B2

OPTICAL INTERCONNECTION DEVICE

CROSS-REFERENCE TO RELATED APPLICATIONS

This U.S. non-provisional patent application claims priority under 35 U.S.C. §119 of Korean Patent Application No. 10-2009-0075063, filed on Aug. 14, 2009, the entire contents of which are hereby incorporated by reference.

BACKGROUND

The present invention herein relates to an optic interconnection device, and more particularly, to an optic interconnection device with enhanced operation characteristics.

As techniques for manufacturing semiconductor devices with a minimum line width of less than sub-micron advance, chips having a very fast clock speed of above 1 GHz have been developed. However, operation speed of each device in ultra large scale integration (ULSI) chips is limited by delay of transmission rate in an interconnection between devices. The delay of transmission rate due to the interconnection increases as data transmission distance between a chip and another chip, between a board and another board and between a device and another device increases. In particular, as the integration of system on chip (SOC) and the chip size increases, a contact resistance between semiconductor and a metal interconnection increases geometrically and resistance of the metal interconnection itself, inductance and a signal interference between interconnections increase. To this end, transmission time delay inside an IC chip having a clock speed of more than several tens GHz or between chips becomes a limitation and thus it is necessary to convert an electrical signal to an optical signal and transmit the converted optical signal.

To solve this limitation, a technique applying an optical interconnection instead of a metal interconnection as an interconnection between semiconductor devices is being considered. An optical interconnection device including devices connected through an optical interconnection provides several advantages such as high bandwidth in data transmission, small crosstalk between channels or small electro-magnetic interference (EMI), parallel processing function, high connection density, fan-in and fan-out of many channels, low device power, small signal delay, and effect preventing generation of noise current through ground.

SUMMARY

The present invention provides an optical interconnection device with high speed operation characteristic and enhanced reliability.

Embodiments of the present invention provide optical interconnection devices including: a first semiconductor chip disposed on a germanium-on-insulator (GOI) substrate including a germanium substrate, an insulating layer on the germanium substrate, and a germanium layer on the insulating layer; a light emitter on the GOI substrate, the light emitter receiving an electrical signal from the first semiconductor chip and outputting a light signal; a light detector on the GOI substrate, the light detector sensing the light signal and converting the sensed light signal into an electrical signal; and a second semiconductor chip on the GOI substrate, the second semiconductor chip receiving the electrical signal from the light detector.

In some embodiments, the GOI substrate may include: a first GOI substrate on which the first semiconductor chip and the light emitter are disposed; and a second GOI substrate on which the second semiconductor chip and the light emitter are disposed, wherein the first GOI substrate and the second GOI substrate are disposed separated from each other.

In other embodiment, the above optical interconnection device may further include a circuit substrate on which the first GOI substrate and the second GOI substrate are disposed.

In still other embodiments, the light emitter may include a group III-V compound semiconductor layer.

In yet other embodiments, the first semiconductor chip and the second semiconductor chip may include a transistor comprised of germanium.

In even embodiments, the above optical interconnection device may further include: a hologram light substrate disposed over the light emitter; and a mirror plate disposed over the hologram light substrate.

In yet embodiments, the hologram light substrate may include a hologram transmitter generating a hologram by using the output light signal from the light emitter.

In further embodiments, the light detector may include either a germanium positive intrinsic negative (PIN) photodiode or a germanium photodiode.

In still further embodiments, the above optical interconnection device may further include a light plate disposed below the GOI substrate, wherein the output light signal from the light emitter arrives at the light detector through the light plate.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF THE EMBODIMENTS

Figure 1:
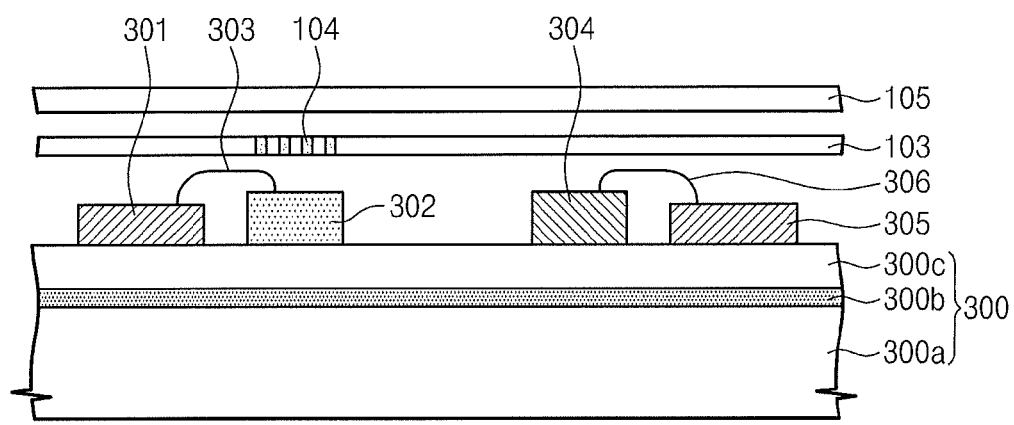
FIG. 1 is a schematic sectional view for illustrating an optical interconnection device according to an embodiment of the present invention.

Hereinafter, embodiments of the present invention will be described with reference to the accompanying drawings to fully explain the present invention in such a manner that it may easily be carried out by a person with ordinary skill in the art to which the present invention pertains. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

It will be understood that although the terms 'first' and 'second' are used herein to describe various elements, these elements should not be limited by these terms. These terms are used only to discriminate one element from another element.

In the figures, elements may be exaggerated for clarity of illustration. Like reference numerals refer to like elements throughout.

Meanwhile, for simplicity in description, several embodiments adopting the technical idea of the present invention will be exemplarily illustrated below, and description for various modified embodiments will be omitted herein. However, a person of ordinary skill in the art can fully modify and apply the various cases adopting the technical idea of the present invention based on the detailed description and the exemplary embodiments.

FIG. 1 is a schematic sectional view for illustrating an optical interconnection device according to an embodiment of the present invention.

Referring to FIG. 1, a first semiconductor chip 301 is disposed on a germanium-on-insulator (GOI) substrate 300. The GOI substrate 300 includes a substrate 300a, an insulating layer 300b and a GOI layer 300c stacked sequentially. The substrate 300a and the GOI layer 300c are of germanium. The GOI substrate 300 may minimize performance degradation due to a parasitic component in a germanium substrate. For example, the GOI substrate 300 may minimize parasitic capacitance and decrease power consumption. The insulating layer 300b may be a germanium oxide layer or silicon oxide layer. A light emitter 302 receiving an electrical signal from the first semiconductor chip 301 and outputting a light signal is disposed on the GOI substrate 300. The light emitter 302 may receive the electrical signal from the first semiconductor chip 301 through a first electrical interconnection 303. The light emitter 302 may be disposed apart aside from the first semiconductor chip 301.

A light detector 304 detecting the output light signal from the light emitter 302 and converting the light signal into the electrical signal is disposed on the GOI substrate 300. Also, a second semiconductor chip 305 receiving the electrical signal from the light detector 304 is disposed on the GOI substrate 300. The second semiconductor chip 305 may receive the light signal from the light detector 304 through a second electrical interconnection 306. The second semiconductor chip 305 may be disposed apart aside from the light detector 302.

The light emitter 302 may include a group III-V compound semiconductor layer. The group III-V compound semiconductor layer may include gallium (Ga) and arsenic (As). The first semiconductor chip 301 and the second semiconductor chip 305 may include a transistor (hereinafter referred to as 'Ge transistor') comprised of germanium (Ge). The Ge transistor may include source/drain formed in the GOI layer 300c, a germanium insulating layer formed on the GOI layer 300c and functioning as a gate insulating layer, and a gate including germanium. Alternatively, the Ge transistor may include a bipolar junction transistor formed of germanium.

A hologram light substrate 103 is disposed over the light emitter 302. A mirror plate 105 is disposed over the hologram light substrate 103. The hologram light substrate 103 may include a hologram transmitter 104 generating a hologram using the output light signal from the light emitter 302. The light emitter 304 may include either germanium positive intrinsic negative (PIN) photodiode or germanium photodiode.

In the optical interconnection device according to the embodiment of the present invention, a light path is as follows. The light emitter 302 receives the electrical signal from the first semiconductor chip 301 disposed on the GOI substrate 300 and outputs the light signal. The output light signal passes through the hologram transmitter 104 disposed in the hologram light substrate 103. At the time, the hologram generated in the hologram transmitter 104 is reflected by the mirror plate 105 and is then incident into the light detector 304. The light detector 304 receives the hologram reflected by the mirror plate 105, converts the received hologram into an electrical signal, and outputs the converted electrical signal to the second semiconductor chip 305.

According to an embodiment of the present invention, the optical interconnection device includes a GOI substrate. The GOI substrate can minimize performance degradation due to a parasitic component in a germanium substrate and can decrease power consumption. Also, the degree of integration of semiconductor devices can be enhanced by simultaneously implementing a light emitter comprised of a group III-V compound semiconductor on the GOI substrate, a light emitter using a germanium PIN photodiode or germanium photodiode on the GOI substrate, and an integrated circuit using a transistor comprised of germanium on the GOI substrate.

Meanwhile, the germanium substrate according to the embodiment of the present invention may have a high carrier mobility characteristic. For example, it is known that the electron mobility of germanium is three times greater than the electron mobility of silicon. Therefore, it is possible to operate an electronic device at a high speed by using the high mobility characteristic of the GOI substrate, and speed-up of wire and wireless communication circuits and high speed data transmission between chips are possible.

Figure 2:
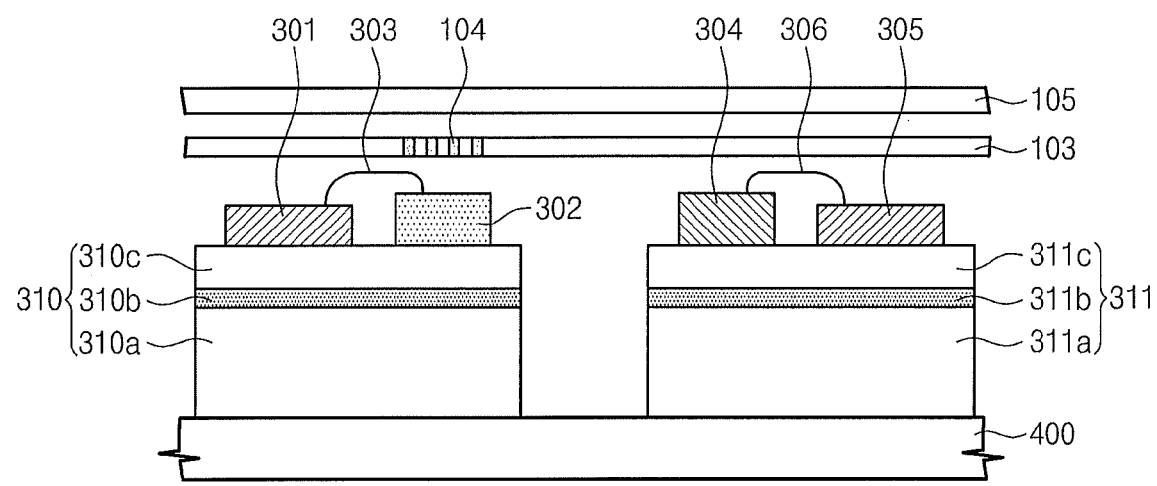
FIG. 2 is a schematic sectional view for illustrating an optical interconnection device according to another embodiment of the present invention.

FIG. 2 is a schematic sectional view for illustrating an optical interconnection device according to another embodiment of the present invention.

Referring to FIG. 2, a circuit substrate 400 is prepared. A first GOI substrate 310 and a second GOI substrate 311 are disposed spaced apart from each other on the circuit substrate 400. The first GOI substrate 310 includes a substrate 310a, an insulating layer 310b and a GOI layer 310c stacked sequentially. The second GOI substrate 311 includes a substrate 311a, an insulating layer 311b and a GOI layer 311c stacked sequentially. The insulating layer 310b, 311b may be a germanium oxide layer or silicon oxide layer. The first GOI substrate 310 and the second GOI substrate 311 may minimize performance degradation due to a parasitic component of a germanium substrate. For example, the first GOI substrate 310 and the second GOI substrate 311 may minimize a parasitic capacitance and decrease power consumption.

A first semiconductor chip 301 is disposed on the first GOI substrate 310. A light emitter 302 receiving an electrical signal from the first semiconductor chip 301 and outputting a light signal is disposed on the first GOI substrate 310. The light emitter 302 may receive the electrical signal from the first semiconductor chip 301 through a first electrical interconnection 303. A light detector 304 detecting the output light signal from the light emitter 302 and converting the light signal into the electrical signal is disposed on the second GOI substrate 311. Also, a second semiconductor chip 305 receiving the electrical signal from the light detector 304 is disposed on the second GOI substrate 311. The second semiconductor chip 305 may receive the light signal from the light detector 304 through a second electrical interconnection 306.

The light emitter 302 may include a group III-V compound semiconductor layer. The group III-V compound semiconductor layer may include gallium (Ga) and arsenic (As). The first semiconductor chip 301 and the second semiconductor chip 305 may include a transistor (hereinafter referred to as 'Ge transistor') comprised of germanium (Ge). The Ge transistor may include source/drain formed in the GOI layer 300c, a germanium insulating layer formed on the GOI layer 300c and functioning as a gate insulating layer, and a gate including germanium. Alternatively, the Ge transistor may include a bipolar junction transistor formed of germanium.

A hologram light substrate 103 is disposed over the light emitter 302. A mirror plate 105 is disposed over the hologram light substrate 103. The hologram light substrate 103 may include a hologram transmitter 104 generating a hologram using the output light signal from the light emitter 302. The light emitter 304 may include either germanium positive intrinsic negative (PIN) photodiode or germanium photodiode.

In the optical interconnection device according to another embodiment of the present invention, a light path is as follows. The light emitter 302 receives the electrical signal from the first semiconductor chip 301 disposed on the first GOI substrate 310 and outputs the light signal. The output light signal passes through the hologram transmitter 104 disposed in the hologram light substrate 103. At the time, the hologram generated in the hologram transmitter 104 is reflected by the mirror plate 105 and is then incident into the light detector 304 disposed on the second GOI substrate 311. The light detector 304 receives the hologram reflected by the mirror plate 105, converts the received hologram into an electrical signal, and outputs the converted electrical signal to the second semiconductor chip 305.

The germanium substrate according to another embodiment of the present invention may have a high carrier mobility characteristic. For example, it is known that the electron mobility of germanium is three times greater than the electron mobility of silicon. Therefore, it is possible to operate an electronic device at a high speed by using the high mobility characteristic of the GOI substrate, and speed-up of wire and wireless communication circuits and high speed data transmission between chips are possible.

Figure 3:
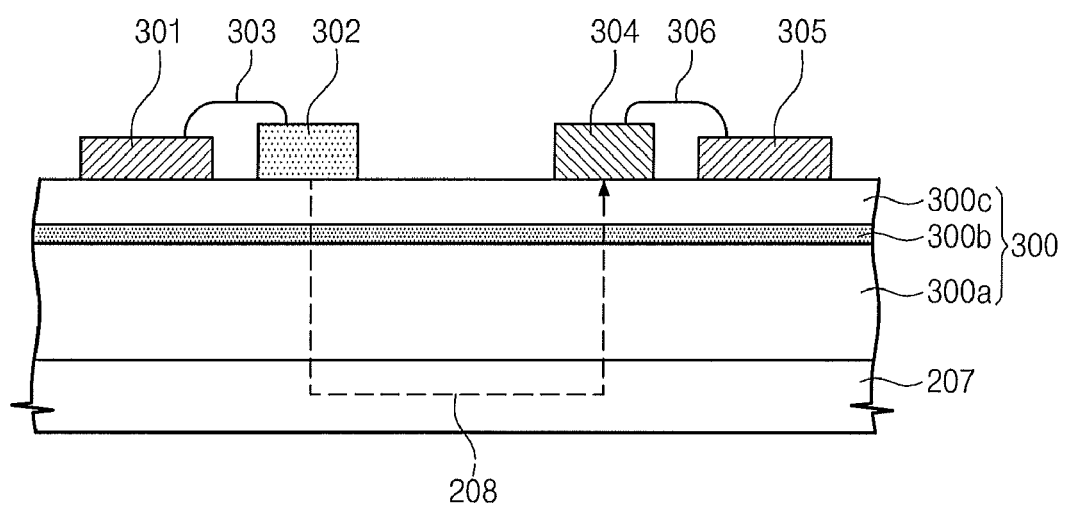
FIG. 3 is a schematic sectional view for illustrating an optical interconnection device according to a modified example of the present invention.

FIG. 3 is a schematic sectional view for illustrating an optical interconnection device according to a modified example of the present invention.

Referring to FIG. 3, a first semiconductor chip 301 is disposed on a germanium-on-insulator (GOI) substrate 300. The GOI substrate 300 may minimize performance degradation due to a parasitic component in a germanium substrate. For example, the GOI substrate 300 may minimize a parasitic capacitance and decrease power consumption. The GOI substrate 300 includes a substrate 300a, an insulating layer 300b and a GOI layer 300c stacked sequentially. The insulating layer 300b may be a germanium oxide layer or silicon oxide layer. A light emitter 302 receiving an electrical signal from the first semiconductor chip 301 and outputting a light signal is disposed on the GOI substrate 300. The light emitter 302 may receive the electrical signal from the first semiconductor chip 301 through a first electrical interconnection 303.

A light detector 304 detecting the output light signal from the light emitter 302 and converting the light signal into the electrical signal is disposed on the GOI substrate 300. Also, a second semiconductor chip 305 receiving the electrical signal from the light detector 304 is disposed on the GOI substrate 300. The second semiconductor chip 305 may receive the light signal from the light detector 304 through a second electrical interconnection 306.

The light emitter 302 may include a group III-V compound semiconductor layer. Each of the first semiconductor chip 301 and the second semiconductor chip 305 may include a transistor (hereinafter referred to as 'Ge transistor') comprised of germanium (Ge). The Ge transistor may include source/drain formed in the GOI layer 300c, a germanium insulating layer formed on the GOI layer 300c and functioning as a gate insulating layer, and a gate including germanium. Alternatively, the Ge transistor may include a bipolar junction transistor formed of germanium.

A light plate 207 is disposed below the GOI substrate 300. The light plate 207 may include an optical waveguide to propagate light. The optical waveguide may be formed by using polymer. The light emitter 304 may include either a germanium positive intrinsic negative (PIN) photodiode or a germanium photodiode.

In the optical interconnection device according to the modified example of the present invention, a light path 208 is as follows. The light emitter 302 receives the electrical signal from the first semiconductor chip 301 disposed on the GOI substrate 300 and outputs the light signal in a downward direction. The output light signal passes through the GOI substrate 300 and arrives at the light plate 207. Thereafter, the light signal is propagated in a horizontal direction along the light plate 207, is branched upwardly and arrives at the light detector 304. To induce the light path, a light passage may be disposed in the substrate 300. That is, the light plate 207 may include an optical waveguide, and the optical passage may be disposed in a vertical direction to the substrate 300 so as to be connected to the optical waveguide. Therefore, the light signal may be transferred from the light emitter 302 to the optical waveguide along the optical passage formed in the vertical direction to the substrate 300, propagated along the optical waveguide in the horizontal direction, and then transferred to the light detector 304 along the optical passage in the vertical direction. The light detector 304 senses the input light signal, converts the sensed light signal into an electrical signal, and transfers the converted electrical signal to the second semiconductor chip 305 through the second electrical interconnection.

The germanium substrate according to still another embodiment of the present invention may have a high carrier mobility characteristic. For example, it is known that the electron mobility of germanium is three times greater than the electron mobility of silicon. Therefore, it is possible to operate an electronic device at a high speed by using the high mobility characteristic of the GOI substrate, and speed-up of wire and wireless communication circuits and high speed data transmission between chips are possible.

While the present invention has been particularly shown and described with reference to exemplary embodiments thereof, it will be understood by those of ordinary skill in the art that various changes in form and details may be made therein without departing from the scope of the present invention. Hence, the scope of the present invention shall not be determined only by the above-described embodiments but shall be determined by the accompanying Claims and their equivalents.

What is claimed is:

1. An optical interconnection device comprising:
   a first semiconductor chip disposed on a germanium-on-insulator (GOI) substrate including a germanium substrate, an insulating layer on the germanium substrate, and a germanium layer on the insulating layer;
   a light emitter on the GOI substrate, the light emitter receiving an electrical signal from the first semiconductor chip and outputting a light signal;
   a light detector on the GOI substrate, the light detector sensing the light signal and converting the sensed light signal into an electrical signal;
   a second semiconductor chip on the GOI substrate, the second semiconductor chip receiving the electrical signal from the light detector;

a hologram light substrate disposed over the light emitter; and a mirror plate disposed over the hologram light substrate, wherein the hologram light substrate comprises a hologram transmitter generating a hologram by using the output light signal from the light emitter.

2. The optical interconnection device of claim 1, wherein the GOI substrate comprises:

a first GOI substrate on which the first semiconductor chip and the light emitter are disposed; and a second GOI substrate on which the second semiconductor chip and the light detector are disposed, wherein the first GOI substrate and the second GOI substrate are disposed separated from each other.

3. The optical interconnection device of claim 2, further comprising a circuit substrate on which the first GOI substrate and the second GOI substrate are disposed.

4. The optical interconnection device of claim 1, wherein the light emitter comprises a group III-V compound semiconductor layer.

5. The optical interconnection device of claim 1, wherein the first semiconductor chip and the second semiconductor chip comprise a transistor comprised of germanium.

6. The optical interconnection device of claim 1, wherein the light detector comprises either a germanium positive intrinsic negative (PIN) photodiode or a germanium photodiode.

7. An optical interconnection device comprising:

a first semiconductor chip disposed on a germanium-on-insulator (GOI) substrate including a germanium substrate, an insulating layer on the germanium substrate, and a germanium layer on the insulating layer;

a light emitter on the GOI substrate, the light emitter receiving an electrical signal from the first semiconductor chip and outputting a light signal;

a light detector on the GOI substrate, the light detector sensing the light signal and converting the sensed light signal into an electrical signal;

a second semiconductor chip on the GOI substrate, the second semiconductor chip receiving the electrical signal from the light detector; and a hologram light substrate disposed over the light emitter; and wherein the hologram light substrate comprises a hologram transmitter generating a hologram by using the output light signal from the light emitter.

* * * * *